US011375635B2

(12) United States Patent
Wu et al.

(10) Patent No.: US 11,375,635 B2
(45) Date of Patent: Jun. 28, 2022

(54) SYSTEM AND METHOD FOR REMOVING COMPONENTS FROM A CHASSIS (71) Applicant: Dell Products L.P., Hopkinton, MA (US)

(72) Inventors: HungWen Wu, New Taipei (TW); Hsiang-Yin Hung, Taipei (TW)

(73) Assignee: Dell Products L.P., Hopkinton, MA (US)

(*) Notice: Subject to any disclaimer, the term of this patent is extended or adjusted under 35 U.S.C. 154(b) by 0 days.

(21) Appl. No.: 16/903,344

(22) Filed: Jun. 16, 2020

(65) Prior Publication Data

US 2021/0392770 A1  Dec. 16, 2021

(51) Int. Cl.
*H05K 7/14* (2006.01)

(52) U.S. Cl.
CPC .................................. *H05K 7/1409* (2013.01)

(58) Field of Classification Search
CPC ........ H05K 7/1409; G06F 1/186; G06F 1/185
See application file for complete search history.

(56) References Cited

U.S. PATENT DOCUMENTS 6,625,035 B1 * 9/2003 Steinman ............. H05K 7/1429
361/759

\* cited by examiner

*Primary Examiner* — James Wu
(74) *Attorney, Agent, or Firm* — Chamberlain, Hrdlicka, White, Williams & Aughtry (57) ABSTRACT A chassis for housing a computing device of an information handling system includes an expansion card receiver. The chassis also includes an electrical receiver decoupler that partially ejects an expansion card from the expansion card receiver when an electrical connector of the expansion card is coupled to an electrical receiver of the expansion card receiver that enables the expansion card to be operably connected to a second component of the computing device. Partially ejecting the expansion card does not require the user of the chassis to physically contact the expansion card directly.

19 Claims, 11 Drawing Sheets

SYSTEM AND METHOD FOR REMOVING COMPONENTS FROM A CHASSIS

BACKGROUND

As the value and use of information continues to increase, individuals and businesses seek additional ways to process and store information. One option available to users is information handling systems. An information handling system (IHS) generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Use cases for information handling systems are causing progressively larger number of information handling systems to be disposed near each other. For example, rack mount systems utilize a rack structure to stack many information handling systems in a vertical arrangement. Due to the changing uses of information handling systems, chassis of information handling systems may modular. That is, a chassis may be composed of multiple enclosures that may be attached to each other to form the chassis of the information handling systems. When the multiple enclosures are attached, components of the information handling system disposed in each of the enclosures may become operably connected to each other.

SUMMARY

In one aspect, a chassis for housing a computing device of an information handling system in accordance with one or more embodiments of the invention includes an expansion card receiver; and an electrical receiver that partially ejects an expansion card from the expansion card receiver when an electrical connector of the expansion card is coupled to an electrical receiver of the expansion card receiver that enables the expansion card to be operably connected to a second component of the computing device. Partially ejecting the expansion card does not require the user of the chassis to physically contact the expansion card directly.

In one aspect, an expansion card receiver in accordance with one or more embodiments of the invention includes an electrical receiver that reversibly operably connects an expansion card to a second component of a computing device; and an electrical receiver decoupler adapted to partially eject the expansion card from the expansion card receiver when an electrical connector of the expansion card is coupled to the electrical receiver. Partially ejecting the expansion card does not require a user to physically contact the expansion card directly.

In one aspect, a method of removing an expansion card from an expansion card receiver in accordance with one or more embodiments of the invention includes applying, by a user, a first force to a first ejector of the expansion card, wherein the first ejector is adapted to rotate in response to the first force; applying, by the user, a second force to a second ejector of the expansion card, wherein the second ejector is adapted to rotate in response to the second ejector; applying, using the first ejector, a third force to a first portion of the expansion card; and while applying the third force, apply a fourth force to a second portion of the expansion card. The third force and the fourth force are applied without physical contact between the user and the expansion card.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a diagram of an information handling system in accordance with one or more embodiments of the invention.

FIG. 1.2 shows a diagram of a chassis in accordance with one or more embodiments of the invention.

FIG. 2.1 shows a diagram of an expansion card receiver in accordance with one or more embodiments of the invention.

FIG. 2.2 shows a diagram of an expansion card and an expansion card receiver in accordance with one or more embodiments of the invention.

FIG. 3.1 shows a diagram of an expansion card and an expansion card receiver prior to application of force in accordance with one or more embodiments of the invention.

FIG. 3.2 shows a diagram of an expansion card and an expansion card receiver after application of force in accordance with one or more embodiments of the invention.

FIG. 3.3 shows a diagram of an expansion card and an expansion card receiver after continued application of force in accordance with one or more embodiments of the invention.

FIG. 3.4 shows a diagram of an expansion card and an expansion card receiver after application of a second force in accordance with one or more embodiments of the invention.

FIG. 4.1 shows a first diagram of an example ejector in accordance with one or more embodiments of the invention.

FIG. 4.2 shows a second diagram of an example ejector in accordance with one or more embodiments of the invention.

DETAILED DESCRIPTION

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing components of an information handling system. An information handling system may be a system that provides computer implemented services. These services may include, for example, database services, electronic communication services, data storage services, etc.

To provide these services, the information handling system may include one or more computing devices. The computing devices may include any number of hardware components that facilitate providing of the services of the information handling system.

Overtime, hardware components may need to be removed from the system. For example, the hardware components may become damaged, outdated, need to be tested, or otherwise need to be temporarily and/or permanently removed.

However, removal of hardware components may be challenging. As computing devices have increased in sophistication, the packing density of hardware components has increased resulting in the hardware components being more susceptible to damage due to improper application of force (e.g., forces for which the components were not designed to receive). For example, connectors between hardware components may be intolerant of forces that result in misalignment of the connectors. Such forces may damage electrical contacts, wiring, cause short circuits, etc.

Embodiments of the invention may provide methods and devices for facilitating removal of hardware components from a system. Specifically, embodiments of the invention may provide an expansion card receiver that orchestrates application of forces required for removal of a component disposed in the expansion card receiver. By orchestrating application of forces to the expansion card, misalignment or other sources of damage to the expansion card and/or expansion card receiver may be avoided.

Figure 11:
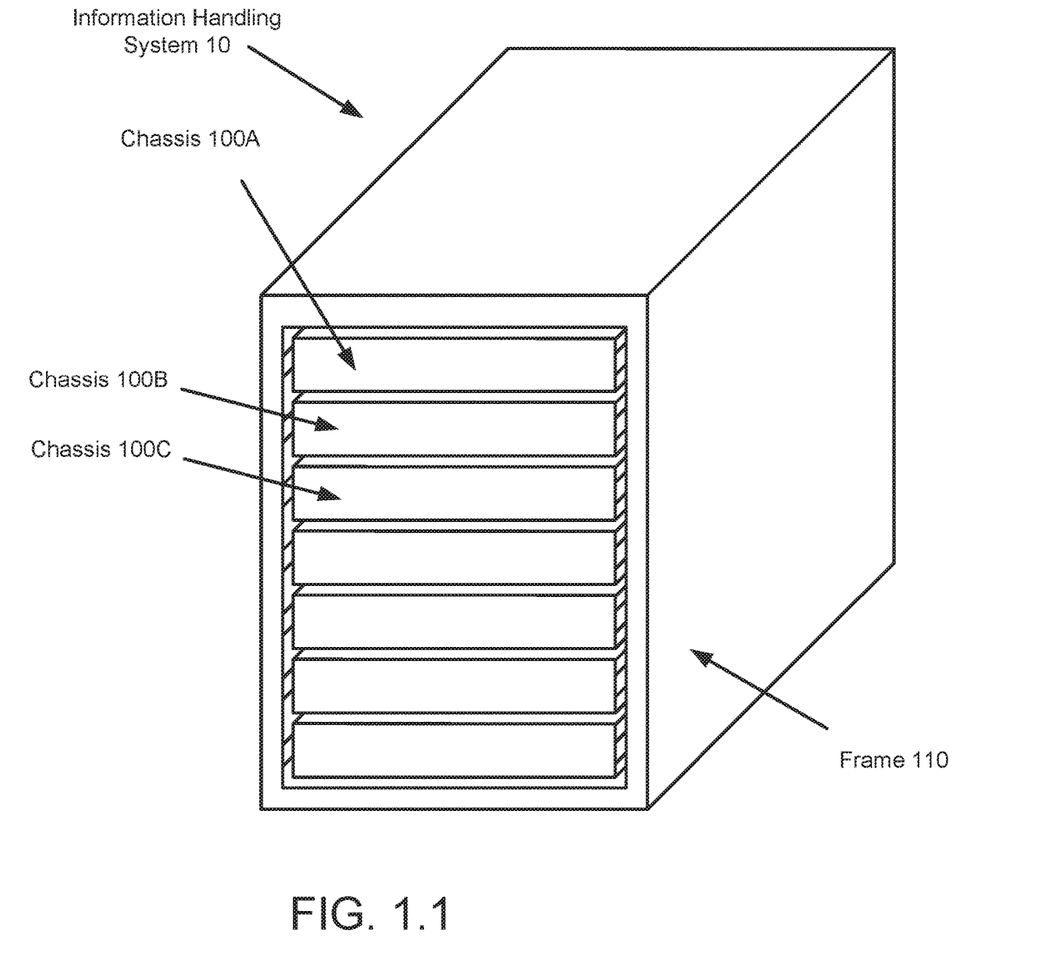

FIG. 1.1 shows an information handling system (10) in accordance with one or more embodiments of the invention. The system may include a frame (110) and any number of chassis (e.g., 110A, 100B, 100C). The frame (110) may be a mechanical structure that enables chassis to be positioned with respect to one another. For example, the frame (110) may be a rack mount enclosure that enables chassis to be disposed within it. The frame (110) may be implemented as other types of structures adapted to house, position, orient, and/or otherwise physically, mechanically, electrically, and/or thermally manage chassis. By managing the chassis, the frame (110) may enable multiple chassis to be densely packed in space without negatively impacting the operation of the information handling system 10.

A chassis (e.g., 100A) may be a mechanical structure for housing components of an information handling system. For example, a chassis may be implemented as a rack mountable enclosure for housing components of an information handling system. The chassis may be adapted to be disposed within the frame (110) and/or utilize services provided by the frame (110) and/or other devices.

Figure 12:
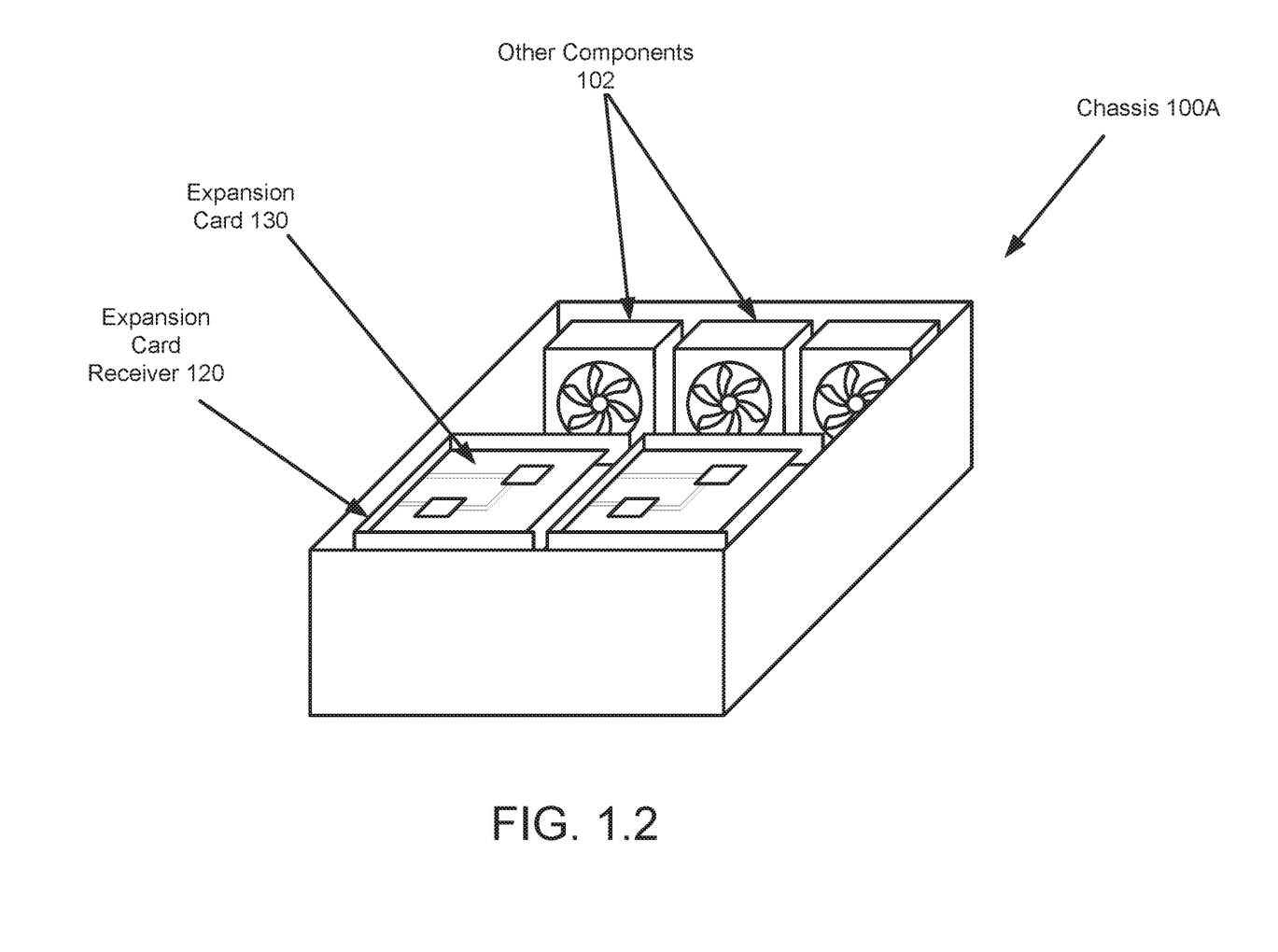

Turning to FIG. 1.2, FIG. 1.2 shows a diagram of a chassis (100A) in accordance with one or more embodiments of the invention. A chassis may be a portion of an IHS and/or house all, or a portion, of an IHS. An information handling system may include a computing device that provides any number of services. To provide services, the computing device may utilize computing resources provided by components. The components may include, for example, processors, memory modules, storage devices, special purpose hardware, and/or other types of physical components that contribute to the operation of the computing device. For additional details regarding computing devices, refer to FIG. 6.

Because the computing device uses computing resources to provide services, the ability of the computing device to provide services is limited based on the number and/or quantity of computing devices that may be disposed within the chassis. For example, by adding additional processors, memory modules, and/or special purpose hardware devices, the computing device may be provided with additional computing resources which it may be used to provide services.

In general, embodiments of the invention provide methods, devices, and systems for managing components that provide computing resources. Specifically, embodiments of the invention may provide a chassis that includes an expansion card receiver (120). The expansion card receiver (120) may be a physical device for receiving an expansion card (130). The expansion card (130) may be a component that provides computing resources to the computing device at least partially disposed within the chassis.

For example, an expansion card (130) may be a device designed to operably connect to a computing device using a Peripheral Component Interconnect (PCI) slot. The expansion card (130) may include a circuit card upon which any number of hardware components is disposed. The circuit card may operably connect the hardware components to the computing device via the PCI slot.

To connect to the PCI slot, the expansion card (130) may include an edge connector or another type of connector designed to physically and/or electrically connect to the PCI slot or another type of expansion card receiver. When so connected, the wiring on the circuit card of the expansion card (130) may operably connect the components of the expansion card (130) to any number of other components that are operably connected to the expansion card receiver.

However, physically and/or electrically connecting and/or disconnecting the expansion card (130) via the expansion card receiver (120) may be challenging. For example, the expansion card (130) may include many components that may be subject to damage if a user of the chassis (100A) applies force to the expansion card (130). Further, if the expansion card (130) is misaligned during insertion into and/or removal from the expansion card receiver (120), the expansion card (130) and/or expansion card receiver (120) may be damaged.

An expansion card receiver (120) in accordance with embodiments of the invention may include a mechanism for decoupling the expansion card from the expansion card receiver (120) thereby avoiding some of these potential scenarios in which the expansion card (130) and/or expansion card receiver (120) may be damaged. The mechanism may reduce the likelihood that (i) the expansion card is misaligned during decoupling and/or (ii) that damaging forces are applied to portions of the expansion card (130) during removal.

In addition to the expansion card receiver (120) and expansion card (130), any number of other components (102) may be disposed in the chassis (100A). The other components (102) may include thermal management components such as fans, computing components such as processors, etc.

Figure 21:
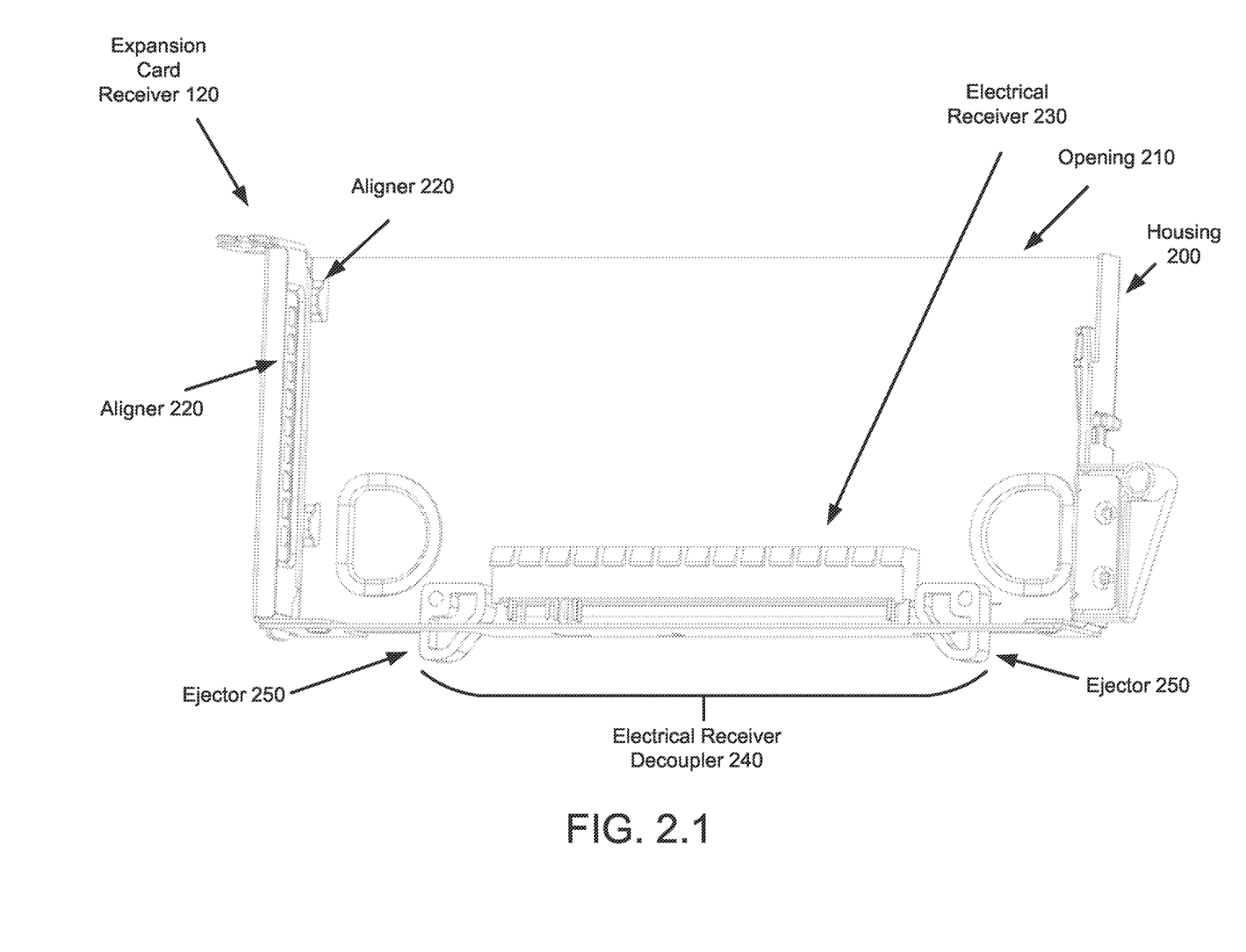
Figure 22:
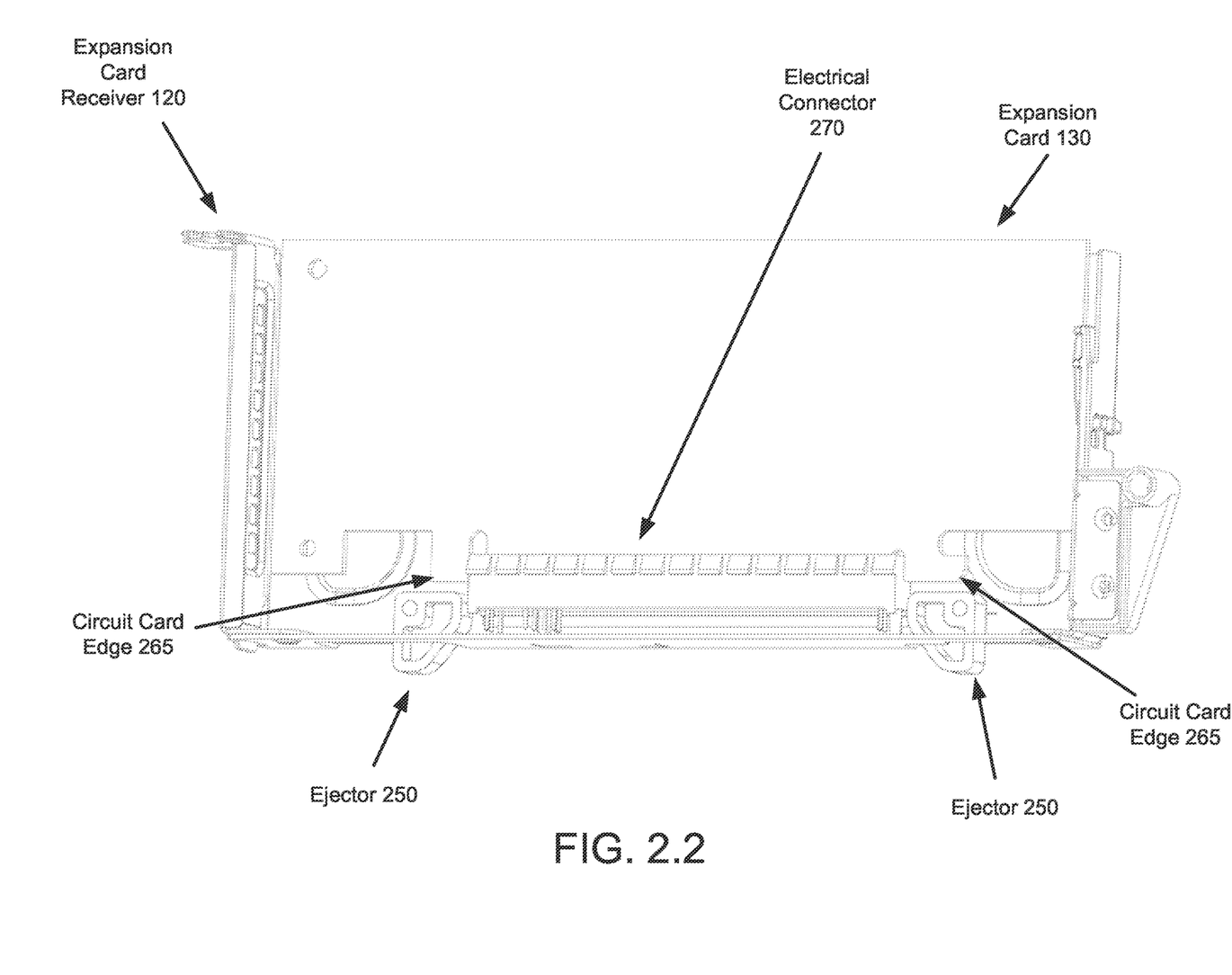

To further clarify aspects of embodiments of the invention, a diagram of an expansion card receiver (120) without an expansion card (e.g., 130) is provided in FIG. 2.1 and a diagram of the expansion card receiver (120) with an expansion card (e.g., 130) is provided in FIG. 2.2.

Turning to FIG. 2.1, FIG. 2.1 shows a diagram of the expansion card receiver (120) in accordance with one or more embodiments of the invention. As discussed above, the expansion card receiver (120) may be adapted to receive expansion cards. When received by the expansion card receiver (120), an expansion card may be operably connected to other components of, for example, the computing device. Additionally, the expansion card receiver (120) may position and/or orient the expansion card. By positioning and/or orienting the expansion card, the number of components within a chassis may be increased by improving the packing density of components within the chassis.

However, by improving the packing density of components within a chassis, the expansion card receiver (120) may be disposed within a portion of the chassis that makes interacting with an expansion card disposed within the expansion card receiver (120) more difficult. For example, it may be more difficult for a user of the chassis to use their fingers to apply forces to the expansion card directly. Consequently, it may be more likely that application of force by a user to an expansion card result in mechanical damage to the expansion card by (i) skewing the expansion card, (ii) directing forces towards less mechanically robust portions of the expansion card, (iii) preventing a user from being able to see all, or a portion, of the expansion card during insertion/removal, etc.

To address these, and other potential problems, the expansion card receiver (120) may include a housing (200). The housing (200) may be up mechanical structure in which the expansion card may be disposed. For example, the housing (200) may be a mechanical structure formed from bent sheet-metal that has an internal volume adapted to receive an expansion card. The internal volume may be adapted with a predetermined form factor (e.g., PCI) in mind.

To enable expansion cards to be inserted into and/or removed from the housing (200), the housing (200) may include an opening (210) on at least one face of the internal volume of the housing (200). The opening (210) may have a cross-section adapted to enable an expansion card to be inserted into and/or removed from the internal volume of the housing (200). The opening (210) may be on the face of the internal volume of the housing (200) opposite of an electrical receiver (230) of the housing.

The housing (200) may include any number of aligners (e.g., 220). An aligner may be a physical structure adapted to guide an expansion card along a predetermined path (e.g., an insertion/removal path) when an expansion card is inserted into and/or removed from the housing (200). For example, the aligners (e.g., 220) may be implemented as protrusion, slots, or other types of structures having shapes complimentary to features on an expansion card. The housing (200) may include any number of aligners.

The expansion card receiver (120) may also include an electrical receiver (230). Electrical receiver (230) may be a component adapted to enable an expansion card disposed within the expansion card receiver (120) to be operably connected to other components when the expansion card is disposed within the expansion card receiver (120). For example, the expansion card receiver (120) may be an electrical connector having a form factor compatible with a particular standard. In one or more embodiments of the invention, the expansion card receiver (120) is an electrical connector compliant with a PCI standard.

The electrical receiver (230) may include any number of electrical contact pads that are adapted to form electrical contacts with corresponding electrical contact pads disposed on an expansion card. The electrical contact pads of the electrical receiver (230) may be connected via circuitry to other components of a computing device. Similarly, the electrical contact pads of the expansion card may be connected via circuitry to other components of the expansion card. Consequently, when an electrical connector of an expansion card is coupled (e.g., connected to, operably connected to, etc.) is electrical connected to the electrical receiver (230) the components of the expansion card may be connected to other components (e.g., of a computing device) via the contacts formed between the electrical contact pads of the expansion card and the electrical receiver (230).

However, due to the pitch and size of the electrical contacts of the expansion card and electrical receiver, a high degree of alignment between the electrical connector of the expansion card and the electrical receiver may be required. To attain the required degree of alignment, the electrical receiver (230) may include packaging that prevents the expansion card from connecting to the electrical receiver (230) unless an appropriate level of alignment is obtained. To prevent such connections from occurring, the electrical receiver (230) may include mechanical interference features or other types of mechanical methods of alignment. These methods may create significant frictional force between the electrical receiver (230) and the expansion card when the expansion card is attached to the electrical receiver (230).

Further, the aforementioned mechanical features may limit the ability of the expansion card to move except for a predetermined direction of removal. For example, with reference to FIG. 2.1, the electrical receiver (230) may limit the ability of an expansion card to move in any direction other than upwardly with respect to the orientation of FIG. 2.1. In other words, towards the top of the page. Consequently, it may be difficult for a user of the chassis to apply appropriate force directed upwardly on an expansion card when disposed within the housing (200) by virtue of (i) the direction of required force and (ii) other components within a chassis that may limit the ability of the user to manipulate the expansion card by direct physical contact.

To address these and other concerns, the expansion card receiver (120) may include an electrical receiver decoupler (240). The electrical receiver decoupler (240) may be a physical structure adapted to decouple an expansion card from the electrical receiver (230). To do so, the electrical receiver decoupler (240) may enable force to be applied to a portion of the expansion card proximate to the electrical receiver (230). The applied force may be in an ejection (e.g., removal) direction of the expansion card.

To apply the aforementioned force, the electrical receiver decoupler (240) may include ejectors (e.g., 250). An ejector may be a physical device adapted to receive force from a user and apply a second force to an expansion card. The force received from the user may not be directed along an ejection direction of the expansion card. For example, the force provided by the user may be directed perpendicularly (e.g., as illustrated in FIG. 2.1) or other directions that are not aligned with the ejection direction of the expansion card. For additional details regarding application of force to an ejector, refer to FIGS. 3.1-3.4.

When the ejectors receive force from a user, the ejectors (250) may be adapted to rotate about a pivot. The rotation of the ejectors (250) may redirect the force applied to the ejectors (250) in a direction coincident with the ejection direction of the expansion card. By doing so, the ejectors (250) may enable users to apply force to components other than an expansion card which translates that force into one applied to the expansion card.

Any of the components illustrated in FIG. 2.1 may be formed from materials such as, for example, metals or plastics. For example, the housing (200), aligners, and other components may be formed from sheets of aluminum, brass, etc. In another example, the ejectors (e.g., 250) may be formed from plastics such as polytetrafluoroethylene.

While the expansion card receiver (120) has been illustrated as including a limited number of specific components, an expansion card receiver (120) in accordance with embodiments of the invention may include additional, fewer, and/or different components without departing from the invention.

Turning to FIG. 2.2, FIG. 2.2 shows a second diagram of the expansion card receiver (120) in accordance with one or more embodiments of the invention. Specifically, FIG. 2.2 shows a diagram of an expansion card (130) disposed in the expansion card receiver (120). For simplicity, various components of the expansion card (130) have been removed. For example, the expansion card (130) in FIG. 2.2 is illustrated as a simple sheet of circuit card. However, an expansion card in accordance with embodiments of the invention may include any number of components (e.g., computer chips, resistors, capacitors, etc.).

In FIG. 2.2, the expansion card (130) is illustrated as being disposed in the expansion card receiver (120). In other words, the expansion card (130) is illustrated in a configuration in which the components of the expansion card (130) are operably connected (e.g., electrically connected) to other components through the electrical receiver of the expansion card receiver (120).

As noted above, the expansion card (130) may include a circuit card. The circuit card may include circuitry (e.g., traces, vias, etc.) that operably connects components disposed on the expansion card (130) to each other and to an electrical connector (270) of the expansion card (130).

The electrical connector (270) of the expansion card (130) may be a physical structure that enables electrical contacts between the expansion card (130) and the expansion card receiver (120) to be formed. For example, the electrical connector (270) may include any number of pads, spring loaded bumps, or other features adapted to form electrical connections with corresponding structures disposed on the electrical receiver of the expansion card receiver (120).

The ejectors (e.g., 250) of the expansion card receiver (120) may be adapted to make physical contact with circuit card edges (e.g., 265) or other portions of the expansion card (130) when force is applied to the ejectors. The circuit card edges or other portions of the expansion card (130) may be of sufficient strength to receive the aforementioned force applied by the ejectors without being damaged. The force applied by the ejectors may be directed along an ejection direction of the expansion card (130) and/or similar in magnitude. Consequently, the movement of the expansion card (130), in response to the applied forced, may be in the ejection direction of the expansion card. Accordingly, the likelihood of damage to the expansion card due to, for example, misalignment of the expansion card (130) and/or improper application of force to the expansion card (130) may be reduced.

While the expansion card (130) has been illustrated as including a limited number of specific components, an expansion card in accordance with embodiments of the invention may include additional, fewer, and/or different components without departing from the invention.

Figure 31:
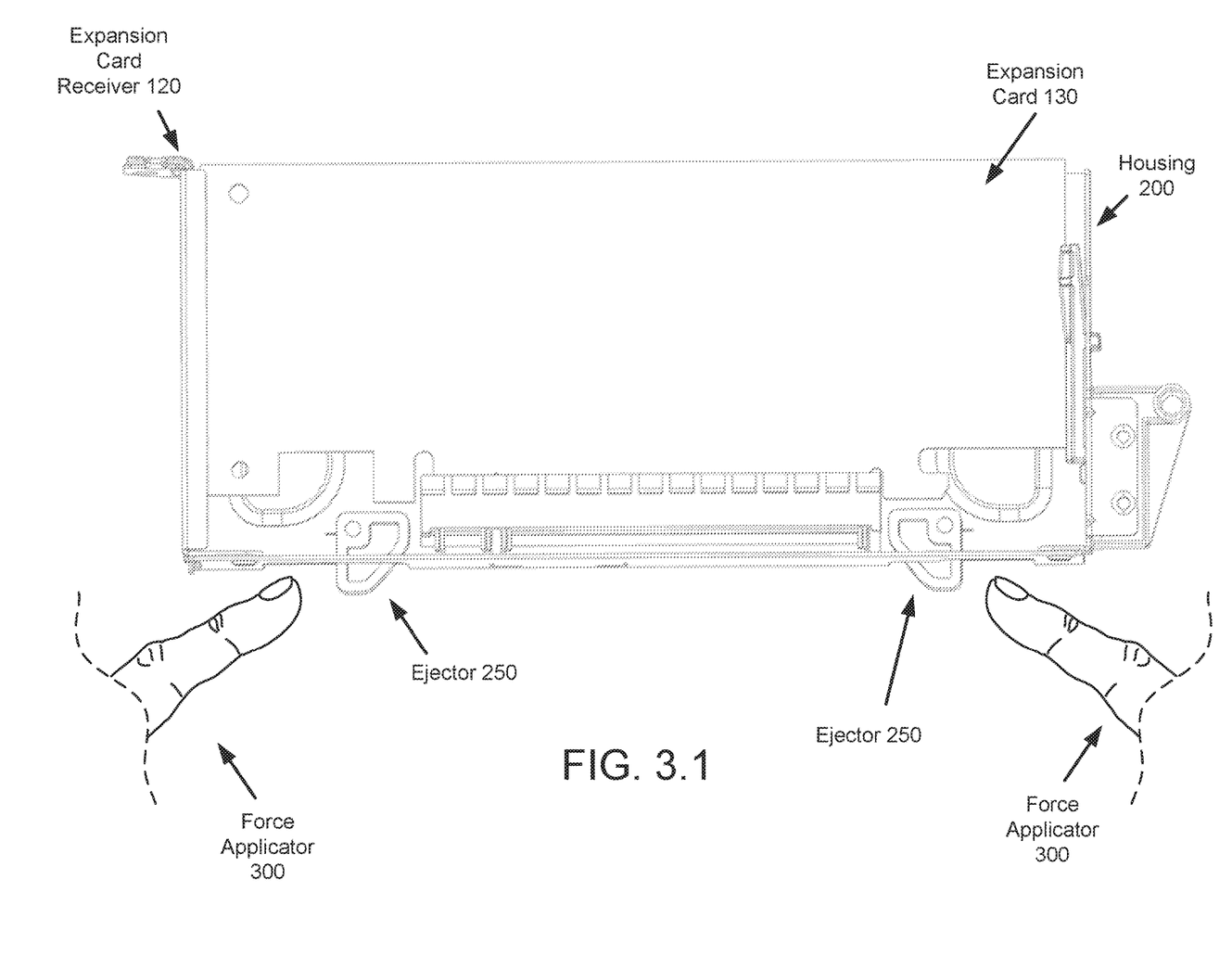

To further clarify aspects of embodiments of the invention, diagrams illustrating ejection of an expansion card from an expansion card receiver are illustrated in FIG. 3.1.

Turning to FIG. 3.1, FIG. 3.1 shows a diagram of an expansion card (130) disposed in an expansion card receiver (e.g., a diagram similar to that illustrated in FIG. 2.2) in accordance with one or more embodiments of the invention. To eject the expansion card (130) from the expansion card receiver (120), force must be applied to the ejectors (e.g. 250). To do so, force applicators (300) are brought into proximity of the ejectors (250).

For example, a user of the chassis may position figures and/or a thumb near the ejectors (250). By virtue of the portion of the ejectors (e.g., 250) protruding from the housing (200) of the expansion card receiver (120), fingers or other digits of the person may be easily brought within proximity of the ejectors (250). For example, even if the housing (200) is disposed next to another device, only a finger width next to the housing (200) needs to be available for a user to apply force to the ejectors (250).

Figure 32:
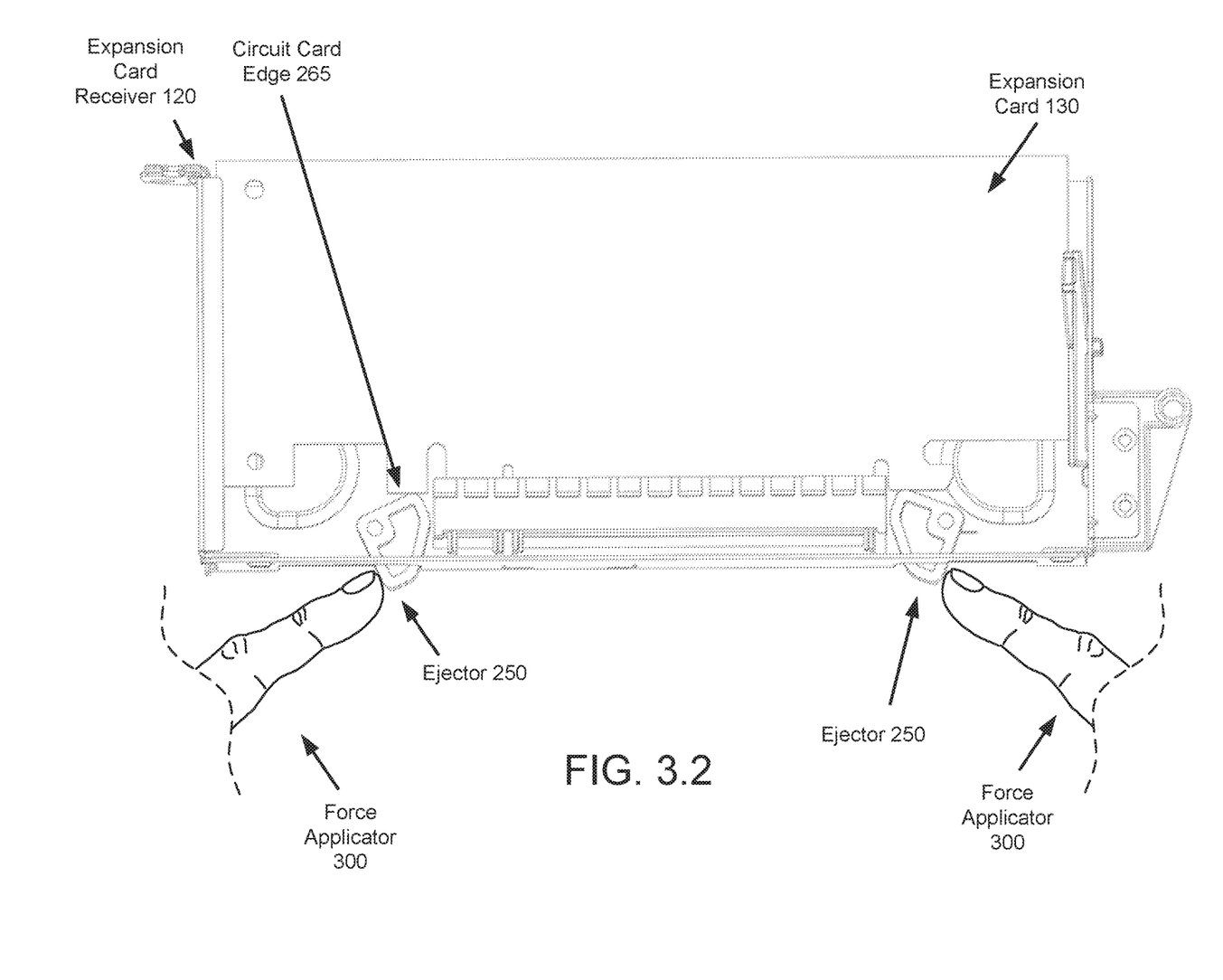

Turning to FIG. 3.2, FIG. 3.2 shows a second diagram of the expansion card (130) disposed in the expansion card receiver in accordance with one or more embodiments of the invention. To start the process of ejecting the expansion card (130), the user begins to apply force to the ejectors (e.g., 250). Specifically, as illustrated in FIG. 3.2, force is applied to the ejector on the left hand side of the page in a manner directed toward the right hand side of the page. In contrast, force is applied to the ejector on the right hand side of the page in a manner directed toward the left hand side of the page.

In other words, the forces applied to each of the ejectors (250) by a user are directed opposite to one another. However, one of ordinary skill in the art will appreciate that the directors may be reoriented to enable forces in other directions to be applied (e.g., the ejector on the left hand side by may mirrored from left to right to enable force to be applied to the left hand ejector directed towards the left). By virtue of the orientations of the ejectors illustrated in FIG. 3.2, natural pinching motions between a thumb and finger may be used to apply appropriate forces to both ejectors simultaneously.

Figure 41:
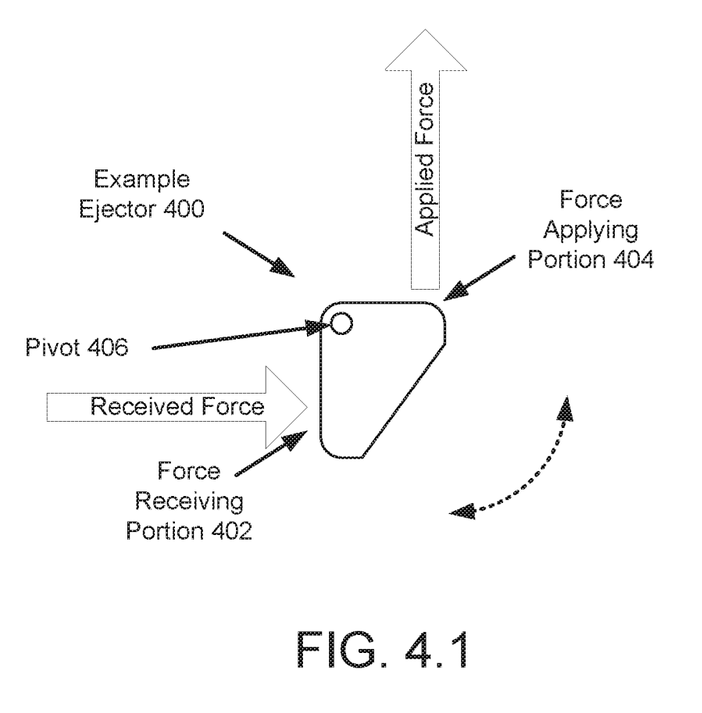
Figure 42:
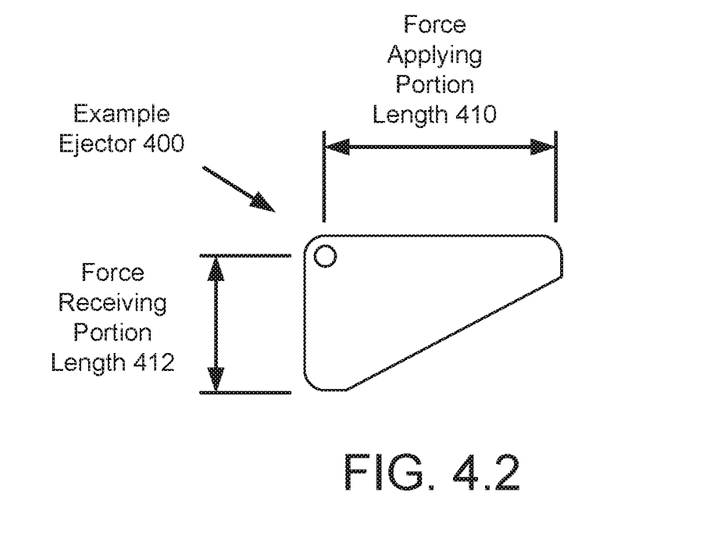

In response to the application of these forces, both of the ejectors (250) begin to rotate about respective pivot points. For details regarding pivot points, refer to FIGS. 4.1-4.2. By rotating in response to the applied forces, the ejectors (250) make contact with corresponding portions of the expansion card (130). For example, the ejectors may make physical contact with circuit card edges (e.g., 265) of the expansion card. However, one of ordinary skill in the art will appreciate that other portions of the expansion card (130) may be contacted by the ejectors without departing from the invention.

When the ejectors (e.g., 250) contact the expansion card (130), the ejectors apply forces to each of the impacted portions of the expansion card (130). In FIG. 3.2, the forces applied by the ejectors are directed upwards in the page. These forces are aligned with the ejection direction of the expansion card (130). Consequently, the forces applied by the ejectors (250) or less likely to damage the expansion card (130) when compared to forces that could be applied by a person grasping, gripping, pinching, or otherwise applying forces to other portions of the expansion card (130).

The forces applied by the ejectors (250) cause the expansion card (130) to move upward along the page with reference to FIG. 3.2. The movement of the expansion card (130) begins to cause the electrical contacts between the expansion card (103) and the expansion card receiver (120) to separate.

Figure 33:
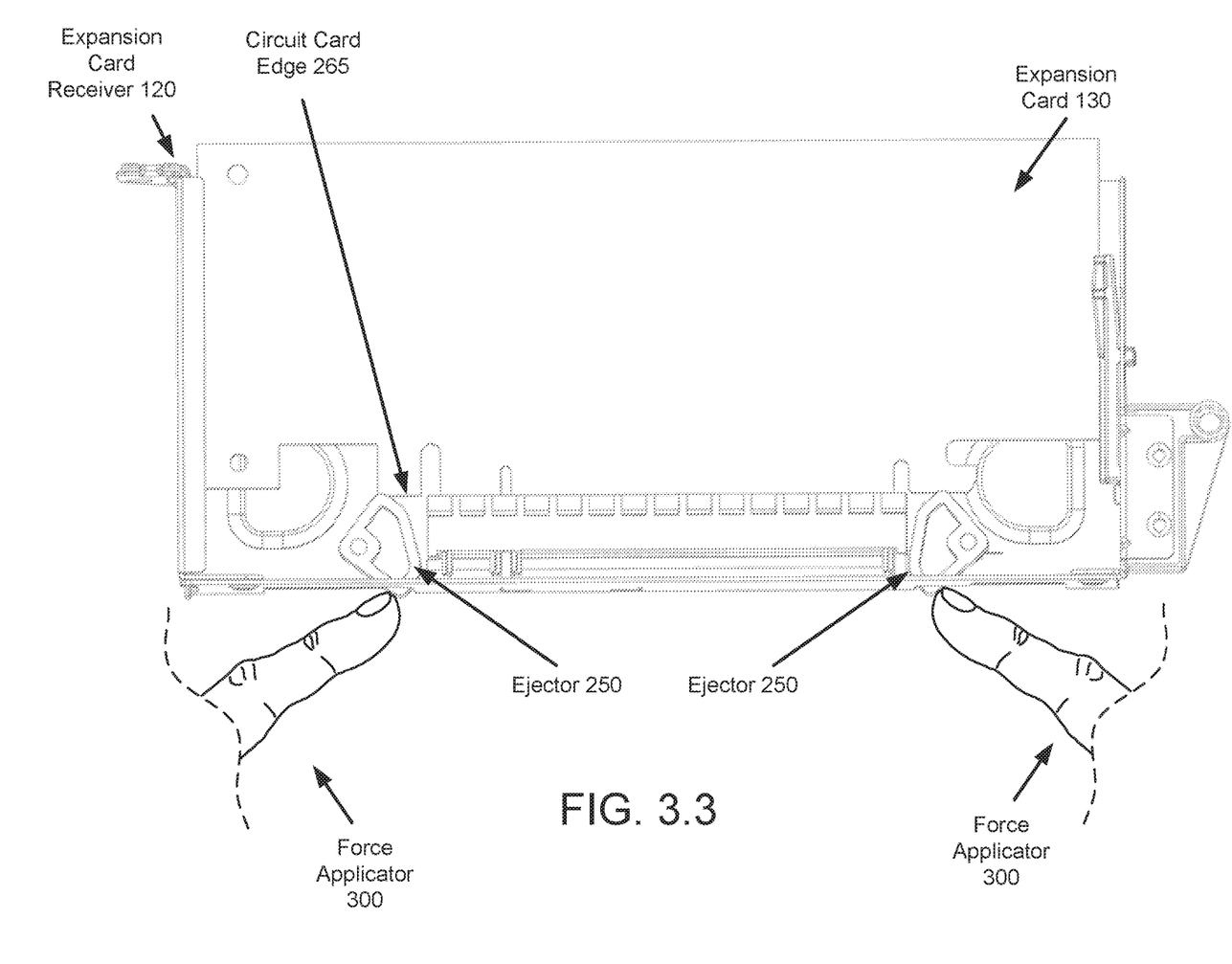

Turning to FIG. 3.3, FIG. 3.3 shows a second diagram of the expansion card (130) in accordance with one or more embodiments of the invention. In FIG. 3.3, force is continued to be applied to the ejectors by the force applications (e.g., 300). Consequently, the expansion card (130) continues to move upward along the page with respect to FIG. 3.3. As the expansion card (130) moves away from the expansion card receiver (120), the electrical contacts between the expansion card (130) and the expansion card receiver (120) completely separate resulting in the expansion card from being partially ejected from the expansion card receiver (120).

For example, in FIG. 3.3, the electrical connector of the expansion card is no longer physically or electrically connected to the electrical receiver of the expansion card receiver (120). The expansion card (130) is still partially disposed in the housing (200) of the expansion card receiver (120). However, because the electrical connector of the expansion card (130) is no longer physical connected to the electrical receiver of the expansion card receiver (120), the amount of force required to move the expansion card (130) within the housing is greatly diminished, the chance of damage due to movement of the expansion card (130) within the housing is reduced, and the likelihood of damage to the expansion card due to the application of force to other parts of the expansion card is reduced.

Figure 34:
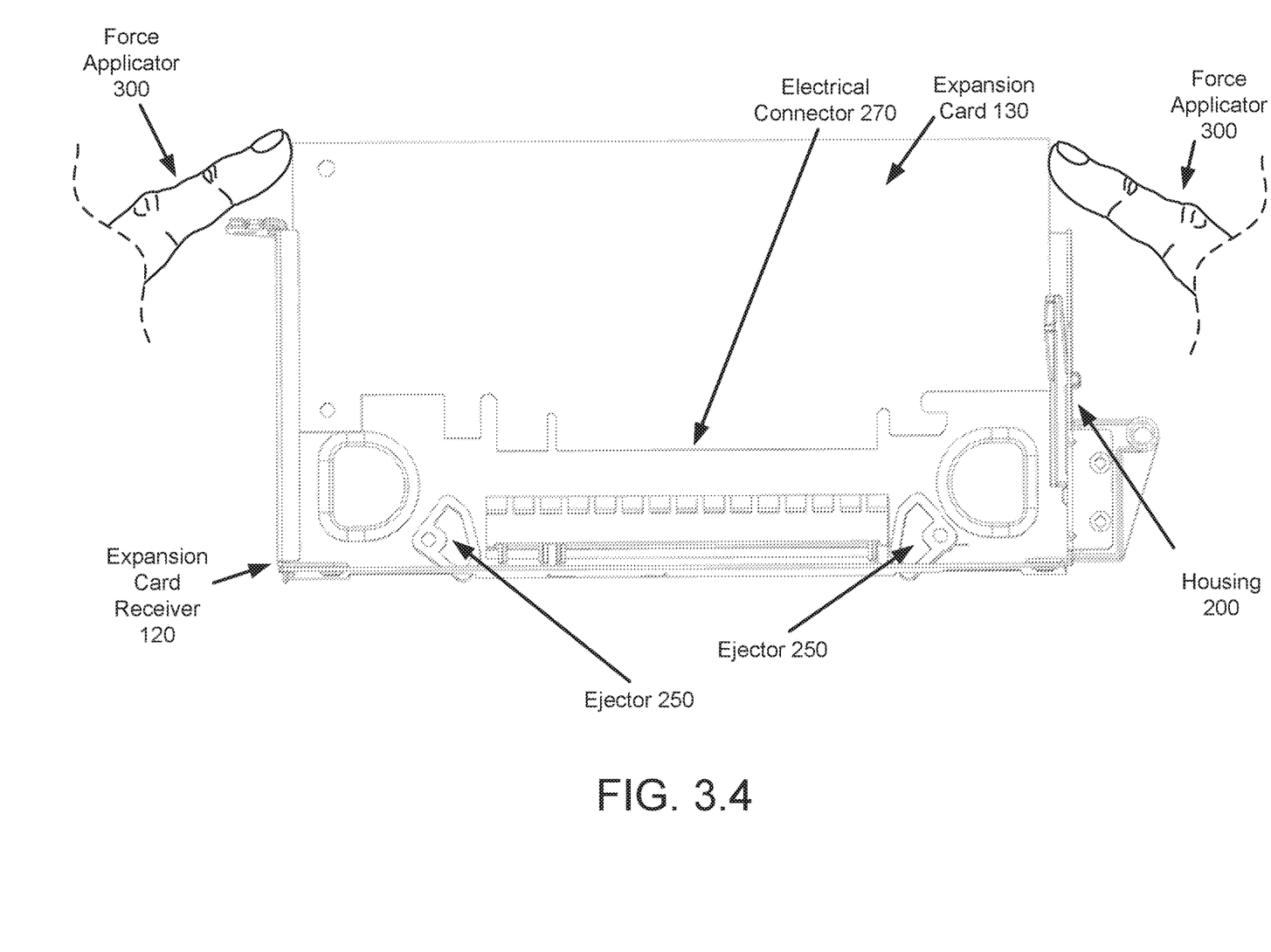

Turning to FIG. 3.4, in FIG. 3.4 shows a fourth diagram of the expansion card (130) in accordance with one or more embodiments of the invention. To complete ejection of the expansion card (130) from the expansion card receiver (120), force is next applied directly to the expansion card (130) by the force applicators. For example, now that the expansion card (130) is not physically connected to the electrical receiver of the expansion card receiver (120), the user may pinch, grasp, or otherwise apply force to other portions of the expansion card (130) to remove it from the housing (200). As the forces applied, the expansion card (130) may continue to move upwardly along the page with respect to FIG. 3.4.

While not illustrated in FIG. 3.4, the ejectors (e.g., 250) may be adapted to return to the position as illustrated in FIG. 3.1 when force is no longer being applied to them. For example, the ejectors (e.g., 250) may be spring loaded or use another mechanism to automatically rotate them back to the position illustrated in FIG. 3.1 when force is no longer being applied to them. For additional details regarding ejectors, refer to FIGS. 4.1-4.2.

Turning to FIG. 4.1, FIG. 4.1 shows a diagram of an example ejector (400) in accordance with one or more embodiments of the invention. As discussed above, the example ejector (400) may be adapted to (i) receive force from a user and (ii) apply a force to an expansion card in response to receiving force.

To do so, the example ejector (400) may include a force receiving portion (402) separated from a force applying portion (404) by a pivot (406). The force receiving portion (402) may be adapted to receive force from a user (e.g., illustrated as the large arrow directed right on the page). When force is received from a user, the pivot (406) may cause the example ejector (400) to rotate thereby moving the force applying portion (404) in a direction different from which force is received. The movement of the force applying portion (404) may cause the aforementioned portion to come in contact with a portion of the expansion card thereby applying force (e.g., illustrated as the large arrow directed upward on the page) to the contacted portion. The force applied by the force applying portion (404) may be directed in a different direction from that of the force received by the force receiving portion (402).

Depending on the structure of the expansion card to which the example ejector (400) is to apply force, the dimensions of the example ejector (400) may be scaled to ensure that appropriate force is applied to corresponding portions of the expansion card.

Turning to FIG. 4.2, FIG. 4.2 shows a second diagram of the example ejector (202) in accordance with one or more embodiments of the invention. In FIG. 4.2, a length of the force applying portion (410) has been modified (e.g., increased in length with respect to FIG. 4.1). By adjusting the lengths of the force receiving portion (e.g., 412) and force applying portion, the portion of the expansion card which is contacted by the force applying portion (404) may be modified. Additionally, various mechanical advantages may be adjusted with respect to the ratio of received vs applied forces.

Returning to FIG. 2.1, an expansion card receiver (120) may be used to partially eject an expansion card.

Figure 5:
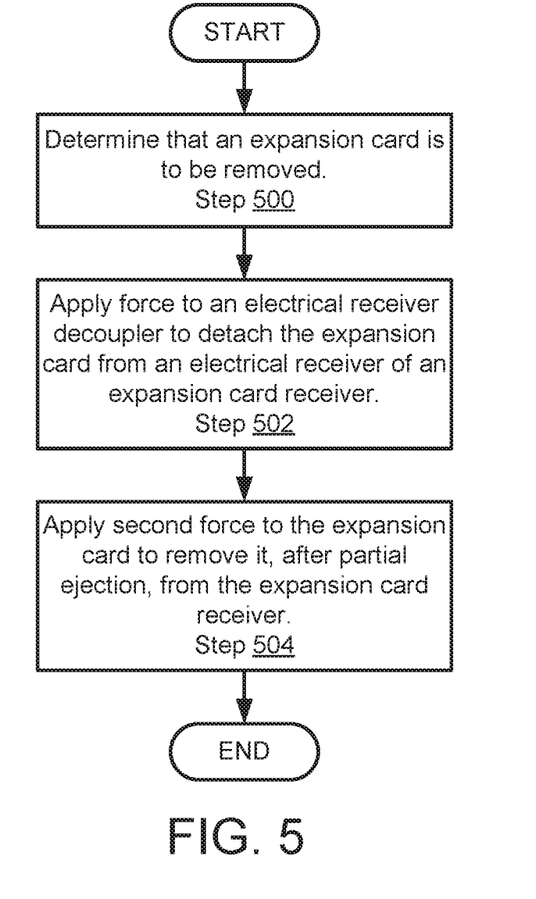
FIG. 5 shows a flowchart of a method of removing an expansion card in accordance with one or more embodiments of the invention.

FIG. 5 shows a method that may be performed to eject an expansion card from an expansion card receiver. While FIG. 5 is illustrated as a flowchart including a number of steps, methods in accordance with embodiments of the invention may include additional, fewer, and/or different steps without departing from the invention. Additionally, while the steps illustrated in FIG. 5 are illustrated in a particular order, the steps may be performed in a different order, any number of steps may be omitted, any number of steps may be repeated, and/or any number of steps may be performed in a parallel or partially overlapping manner without departing from the invention. The method shown in FIG. 5 may be performed by, for example, an expansion card receiver (e.g., 120, FIG. 2.1).

In step 500, it is determined that an expansion card is to be removed. The determination may be made, for example, based on an indication provided by a computing device disposed in a chassis. The chassis may include an expansion card receiver in which the expansion card is disposed.

For example, when an expansion card fails, enters an error state, or becomes otherwise inoperable, it may be necessary to remove the expansion card. By removing the expansion card, the expansion card may be tested, the expansion card receiver may be tested, the computing device operably connected to the expansion card may be tested, and/or other diagnostic testing be performed. Similarly, by removing the expansion card, a different expansion card having similar capabilities and/or features may be replaced in the expansion card receiver thereby enabling the computing device which the expansion card receiver is operably connected to continue to use the functionality of the newly replaced expansion card.

In step 502, force is applied to an electrical receiver decoupler to detach the expansion card from electric receiver of the expansion card receiver. More specifically, force may be applied to at least two ejectors of the electrical receiver decoupler. The force applied may include a first force applied to a first ejector and a second force applied to a second ejector. The forces may be applied in opposite directions to one another.

For example, a thumb and finger of a person may separately apply the forces to the ejectors via a pinching motion. Forces may be applied via other methods without departing from the invention.

When force is applied to the ejectors, as discussed above, the ejectors may convert those forces into two additional forces directed in an ejection direction of the expansion card. For example, as discussed above, the ejectors may rotate thereby converting the direction of the forces received by the ejectors to forces applied to the expansion card in an ejection direction of the expansion card.

When the force is applied to the expansion card, the force may cause the electrical connector on the expansion card to decouple from the electrical receiver of the expansion card receiver. However, the expansion card may only be partially ejected by the aforementioned application of force by the ejectors. Thus, additional force may still need to be applied to the expansion card for it to be completely removed from the housing of the expansion card receiver.

In step 502, a user may not directly, physically contact the expansion card. Consequently, a user may be less likely to damage the expansion card by improper application of force to the expansion card. Rather, by applying pressure to the ejectors, force may be indirectly applied to portions of the expansion card that are less likely to be damaged by the application of force. Additionally, by applying this force, the electrical connector of the expansion card may be decoupled from the electrical receiver of the expansion card receiver thereby reducing the quantity of force required to complete the removal of the expansion card.

In step 504, a second force is applied to the expansion card to remove it, after partial ejection, from the expansion card receiver.

For example, after the expansion card is partially ejected, a portion of the expansion card may be protruding from a housing of the expansion card receiver. The user may then grasp, pinch, or otherwise manipulate the protruding portion of the expansion card to remove the remainder of the expansion card from the expansion card receiver.

The method may end following step 504.

Using the method illustrated in FIG. 5, an expansion card may be removed from an expansion card receiver in a manner that is less likely to damage the expansion card and/or the expansion card receiver.

Figure 6:
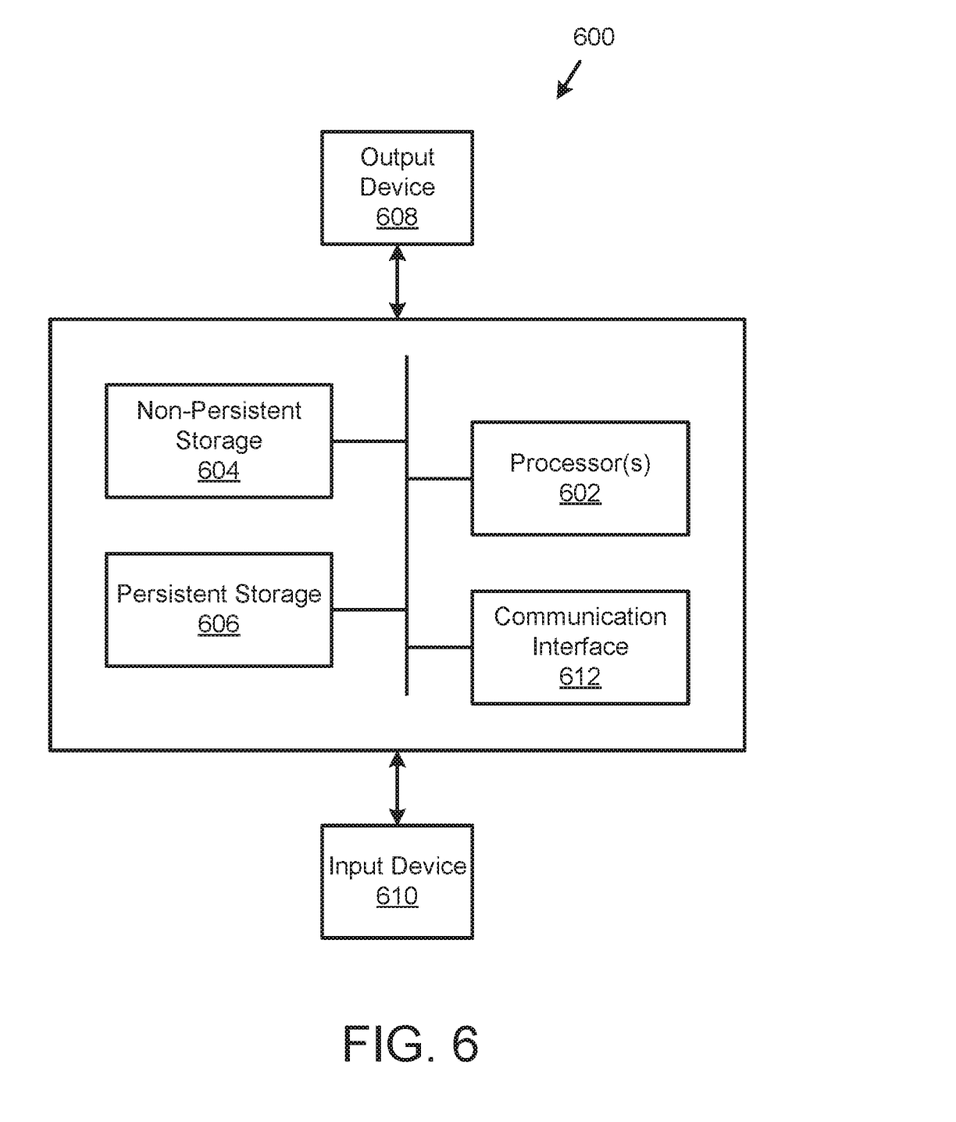
FIG. 6 shows a diagram of a computing device in accordance with one or more embodiments of the invention.

As discussed above, embodiments of the invention may be implemented using a computing device. FIG. 6 shows a diagram of a computing device in accordance with one or more embodiments of the invention. The computing device (600) may include one or more computer processors (602), non-persistent storage (604) (e.g., volatile memory, such as random access memory (RAM), cache memory), persistent storage (606) (e.g., a hard disk, an optical drive such as a compact disk (CD) drive or digital versatile disk (DVD) drive, a flash memory, etc.), a communication interface (612) (e.g., Bluetooth interface, infrared interface, network interface, optical interface, etc.), input devices (610), output devices (608), and numerous other elements (not shown) and functionalities. Each of these components is described below.

In one embodiment of the invention, the computer processor(s) (602) may be an integrated circuit for processing instructions. For example, the computer processor(s) may be one or more cores or micro-cores of a processor. The computing device (600) may also include one or more input devices (610), such as a touchscreen, keyboard, mouse, microphone, touchpad, electronic pen, or any other type of input device. Further, the communication interface (612) may include an integrated circuit for connecting the computing device (600) to a network (not shown) (e.g., a local area network (LAN), a wide area network (WAN) such as the Internet, mobile network, or any other type of network) and/or to another device, such as another computing device.

In one embodiment of the invention, the computing device (600) may include one or more output devices (608), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (602), non-persistent storage (604), and persistent storage (606). Many different types of computing devices exist, and the aforementioned input and output device(s) may take other forms.

Embodiments of the invention may provide an improved method for managing components of an information handling system. Specifically, embodiments of the invention may provide a method and device for facilitating removal of expansion cards in a manner that is less likely to result in damage to the expansion card and/or expansion card holder. To do so, embodiments of the invention may provide an expansion card receiver that includes an electrical receiver decoupler. The electrical receiver decoupler may be a physical structure that reduces the complexity of applying force to an expansion card during decoupling of the electrical connector of the expansion card from the electrical receiver of the expansion card receiver. By reducing the complexity of applying force, potential damage to an expansion card during ejection may be avoided.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A chassis for housing a computing device of an information handling system, comprising:
   an expansion card receiver comprising:
      an electrical receiver; and
      an electrical receiver decoupler adapted to partially eject an expansion card from an internal space of the expansion card receiver, wherein the electrical receiver decoupler comprises:
         a first ejector adapted to receive a first force from a user of the chassis, wherein the first ejector is adapted to rotate about a pivot in response to receiving the first force from the user such that the first ejector is pushed into the internal space of the expansion card receiver to contact and push the expansion card out of the expansion card receiver, wherein a distance between the pivot and the electrical receiver remains constant while the expansion card is partially ejected,
   wherein partially ejecting the expansion card does not require the user of the chassis to directly physically contact the expansion card.

2. The chassis of claim 1, wherein applying the first force causes the first ejector to apply a second force that is continuous with the first force to a first portion of the expansion card.

3. The chassis of claim 2, wherein the first force received from the user is not directed in a removal direction of the expansion card.

4. The chassis of claim 3, wherein the second force is directed in the removal direction.

5. The chassis of claim 2, wherein the electrical receiver decoupler further comprises:
   a second ejector disposed on the expansion card receiver, wherein the first ejector and the second ejector are separated from each other by the electrical receiver.

6. The chassis of claim 5, wherein the second ejector is adapted to receive a third force from the user of the chassis and apply a fourth force that is continuous with the third force to a second portion of the expansion card.

7. The chassis of claim 6, wherein the second force and the fourth force are in a same direction.

8. The chassis of claim 6, wherein the first force and the third force are in opposite directions to each other.

9. The chassis of claim 1, wherein partially ejecting the expansion card comprises:
   decoupling an electrical connector of the expansion card from the electrical receiver; and
   retaining a portion of the expansion card in a housing of the expansion card receiver.

10. The chassis of claim 9, wherein the housing comprises an aligner adapted to prevent misalignment of the portion of the expansion card after the expansion card is partially ejected from the expansion card receiver.

11. The chassis of claim 9, wherein decoupling the electrical connector from the electrical receiver mechanically and electrically isolates the electrical connector from the electrical receiver.

12. An expansion card receiver, comprising:
   an electrical receiver adapted to reversibly operably connect to an expansion card; and
   an electrical receiver decoupler adapted to partially eject the expansion card from an internal space of the expansion card receiver, wherein the electrical receiver decoupler comprises:
      a first ejector adapted to receive a first force from a user, wherein the first ejector is adapted to rotate about a pivot in response to receiving the first force from the user such that the first ejector is pushed into the internal space of the expansion card receiver to contact and push the expansion card out of the expansion card receiver, wherein a distance between the pivot and the electrical receiver remains constant while the expansion card is partially ejected,
   wherein partially ejecting the expansion card does not require the user to directly physically contact the expansion card.

13. The expansion card receiver of claim 12, wherein applying the first force causes the first ejector to apply a second force that is continuous with the first force to a first portion of the expansion card.

14. The expansion card receiver of claim 13, wherein the first force received from the user is not directed in a removal direction of the expansion card.

15. The expansion card receiver of claim 14, wherein the second force is directed in the removal direction.

16. The expansion card receiver of claim 13, wherein the electrical receiver decoupler further comprises:
   a second ejector disposed on the expansion card receiver, wherein the first ejector and the second ejector are separated from each other by the electrical receiver.

17. A method of removing an expansion card from an internal space of an expansion card receiver, comprising:
   applying, by a user, a first force to a first ejector of the expansion card receiver, wherein the first ejector is adapted to rotate about a first pivot in response to the first force;
   applying, by the user, a second force to a second ejector of the expansion card receiver, wherein the second ejector is adapted to rotate about a second pivot in response to the second force;
   applying, using the first ejector, a third force to a first portion of the expansion card; and
   while applying the third force:
      applying a fourth force to a second portion of the expansion card,
   wherein the third force and the fourth force are applied without direct physical contact between the user and the expansion card,
   wherein a distance between the first pivot and an electrical receiver of the expansion card receiver remains constant while the expansion card is partially ejected,
   wherein a distance between the second pivot and the electrical receiver of the expansion card receiver remains constant while the expansion card is partially ejected,
   wherein the first force pushes the first ejector into the internal space of the expansion card receiver and the second force pushes the second ejector into the internal space of the expansion card receiver such that the first ejector and the second ejector contact and push part of the expansion card receiver, and
   wherein the third force is applied to the first portion of the expansion card when the first ejector pushes against the first portion of the expansion card within the internal space of the expansion card receiver, and
   wherein the fourth force is applied to the second portion of the expansion card when the second ejector pushes against the second portion of the expansion card within the internal space of the expansion card receiver.

18. The method of claim 17, wherein the first force and the second force are directed in opposite directions.

19. The method of claim 18,
wherein the third force and the fourth force are directed in the same direction, and
wherein the third force is continuous with the first force and the fourth force is continuous with the second force.

\* \* \* \* \*